United States Patent [19]
Nakatsugawa et al.

[11] Patent Number: 4,642,519
[45] Date of Patent: Feb. 10, 1987

[54] DIGITAL WAVE OBSERVATION APPARATUS

[75] Inventors: Kenji Nakatsugawa, Kanagawa; Aiichi Katayama, Isehara; Hitoshi Sekiya; Shoji Hiratsuka, both of Atsugi, all of Japan

[73] Assignee: Anritsu Corporation, Tokyo, Japan

[21] Appl. No.: 786,223

[22] Filed: Oct. 9, 1985

[30] Foreign Application Priority Data

Oct. 15, 1984 [JP] Japan .............................. 59-155229[U]

[51] Int. Cl.$^4$ ........................ G01R 23/16; H01J 23/34
[52] U.S. Cl. ...................................... 315/1.0; 315/367; 324/77 A; 324/121 R; 340/734; 364/487
[58] Field of Search ......... 315/367; 324/77 A, 121 R, 324/77 R, 83 D; 364/487; 340/721, 734, 722, 715

[56] References Cited

U.S. PATENT DOCUMENTS

| | | | |
|---|---|---|---|
| 2,962,625 | 11/1960 | Berwin et al. | 315/367 |
| 3,474,438 | 10/1969 | Lauher | 340/722 |
| 4,302,755 | 11/1981 | Pisani et al. | 340/734 |
| 4,346,333 | 8/1982 | Dagostino | 315/367 |
| 4,555,765 | 11/1985 | Crooke et al. | 315/367 |

FOREIGN PATENT DOCUMENTS 59-155229 10/1984 Japan .

Primary Examiner—Harold Dixon
Attorney, Agent, or Firm—Frishauf, Holtz, Goodman & Woodward

[57] ABSTRACT

In a digital wave observation apparatus having an A/D converter for A/D converting an input signal, a trigger level setting device for setting a trigger level, a trigger signal generator for comparing the input signal with a set trigger level and generating a trigger signal, a wave memory for storing an A/D converted input signal in response to the trigger signal, and a display for displaying the input signal stored in the wave memory, the apparatus has a trigger level display device for displaying a horizontal line corresponding to a trigger level on the display irrespective of generation of the trigger signal.

1 Claim, 5 Drawing Figures

DIGITAL WAVE OBSERVATION APPARATUS

BACKGROUND OF THE INVENTION

This invention relates to a digital wave observation apparatus and, more particularly, to an apparatus for always displaying the currently set trigger level.

A typical example of a conventional digital wave observation apparatus is the digital oscilloscope shown in FIG. 1. Referring to FIG. 1 reference numeral 1 denotes a trigger signal generator. In the trigger signal generator 1, a trigger level set by a volume control 2 is compared by an analog comparator 3 with an input signal. When the input signal is larger than the trigger level set by the control 2, a trigger signal is generated by the generator 1. The trigger signal is supplied to a signal fetching controller 4 which then supplies a control signal to a wave memory 6 to cause the memory 6 to write the signal. Digital wave data obtained by an A/D converter 5 are sequentially stored in the memory 6. The digital wave data is read out from the memory 6 under the control of a display controller 7. The readout wave data is displayed on a display 8.

In the conventional oscilloscope, an input signal is used as a trigger source. A trigger point is determined by a preset delay time, and the trigger level can be determined by reading out the input signal value at the trigger point from the wave memory 6. The trigger level can be displayed as a horizontal cursor like an abscissa line or a marker on a screen of the display 8.

In the conventional digital oscilloscope, generation of the trigger signal from the generator 1 has a sequential relationship with fetching of the input signal wave data in the memory 6. When the trigger level is properly set, the trigger level can be displayed on the screen of the display 8, as described above. However, when the trigger level is not properly set, the trigger level cannot be properly displayed on the screen of the display 8.

FIG. 2 shows a display example wherein a delay is effected in the negative direction and a proper trigger level is set. Point A in a waveform 10 displayed on a display screen 9 represents the trigger point. A negative delay time prior to triggering is given by a time interval $\Delta T$ between point B and point A. Wave data of the input signal between point B and point C is stored in the memory 6. Since the negative delay time $\Delta T$ is predetermined, the trigger point A is determined by the delay time $\Delta T$, and the current trigger level can be detected. Therefore, this trigger level 12 is displayed as the solid horizontal line of FIG. 2.

However, when the trigger level 12 is not properly set as shown in FIG. 3, or when a positive delay time is set as shown in FIG. 4, an input signal corresponding to the trigger point cannot be stored in the memory 6. Therefore, neither the trigger level corresponding to the trigger point is present nor the trigger level itself can be displayed on the screen 9 of the display 8.

SUMMARY OF THE INVENTION

It is an object of the present invention to eliminate the conventional drawback described above and to provide a digital wave observation apparatus wherein a trigger level can be displayed on a display screen irrespective of an input signal stored in a wave memory, so that the present trigger level can always be displayed on the display screen.

In order to achieve the above object of the present invention, there is provided a digital wave observation apparatus having an A/D converter for A/D converting an input signal, a trigger level setting device for setting a trigger level, a trigger signal generator for comparing the input signal with a set trigger level and thereby generating a trigger signal, a wave memory for storing an A/D converted input signal in response to the trigger signal, and a display for displaying the input signal stored in the wave memory, comprising a trigger level display device for displaying a horizontal line corresponding to a trigger level on the display irrespective of the generation of the trigger signal.

DETAILED DESCRIPTION OF THE PREFERRED EMBODIMENT

Figure 1:
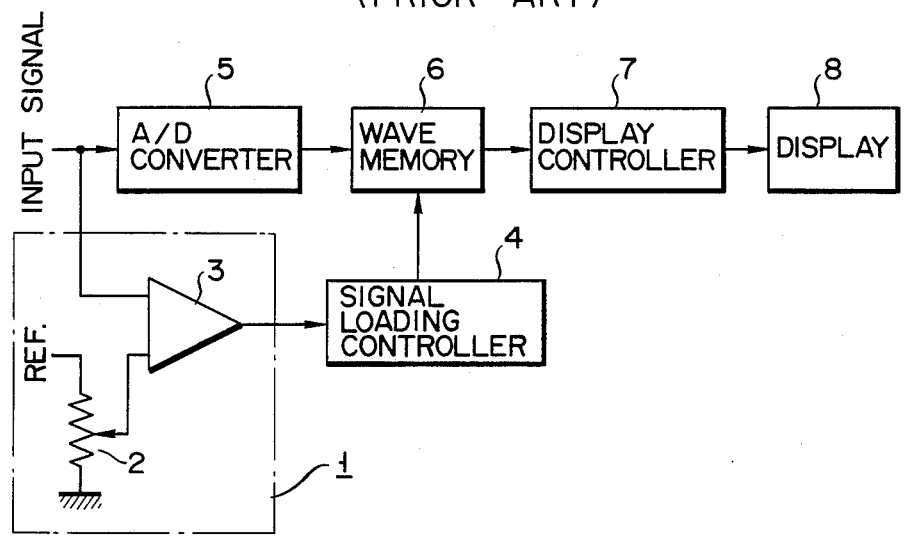
FIG. 1 is a block diagram of a conventional digital wave observation apparatus.
Figure 5:
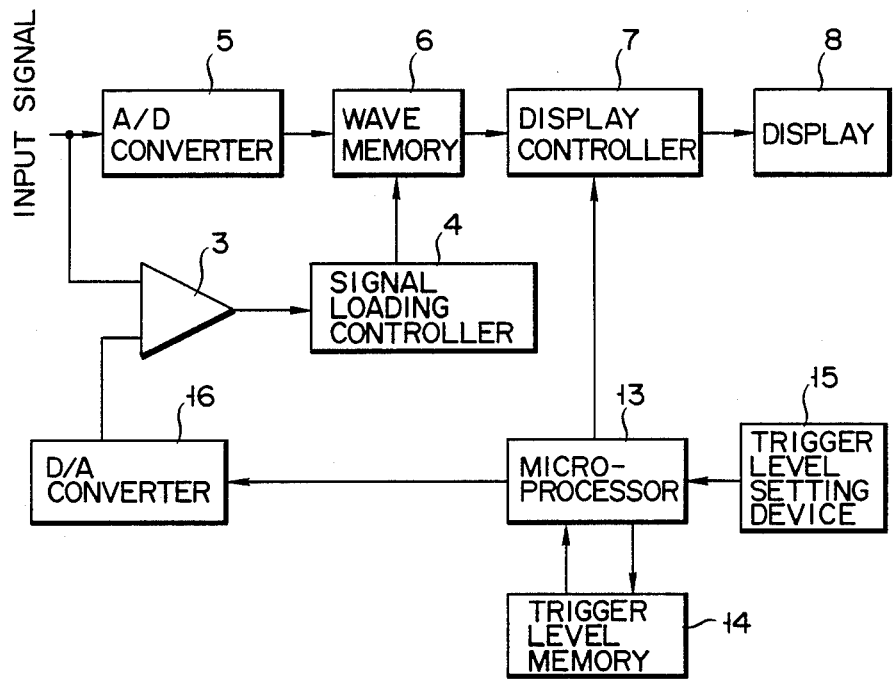
FIG. 5 is a block diagram of a digital wave observation apparatus according to an embodiment of the present invention.
Figure 2:
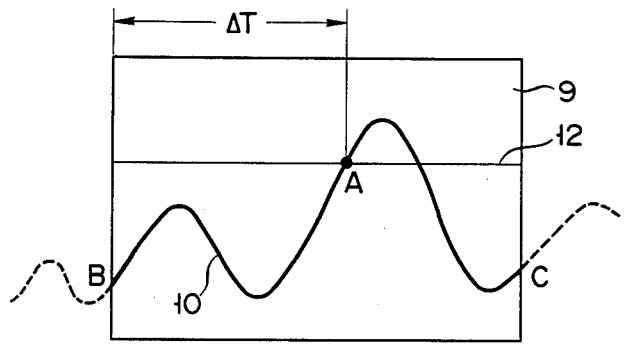
FIGS. 2 to 4 are graphs showing the relationships between the trigger levels and the input signal waveforms, respectively.
Figure 3:
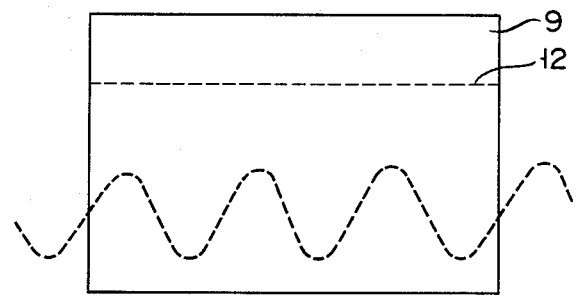
Figure 4:
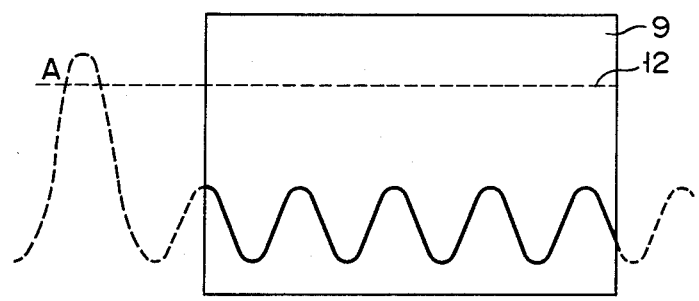

FIG. 5 is a block diagram of a digital oscilloscope as a digital wave observation apparatus according to an embodiment of the present invention. An analog comparator 3, a signal loading controller 4, an A/D converter 5, a wave memory 6, a display controller 7 and a display 8 of the digital oscilloscope are the same as those of FIG. 1, and a detailed description thereof will be omitted. Referring to FIG. 5, reference numeral 13 denotes a microprocessor; 14, a trigger level memory; 15, a trigger level setting device; and 16, a D/A converter.

The device 15 comprises a means for setting a desired trigger level and controls an increase/decrease in trigger level through a dial or key. A desired trigger level set by the device 15 is supplied as a trigger code to the microprocessor 13. Assume that data stored in the memory 14 represents a value "1,0,0,0" and that a trigger level increase command is generated by the device 15. The microprocessor 13 reads out the trigger code "1,0,0,0" from the memory 14, and the readout code is added to the value "0,0,0,1". The resultant code "1,0,0,1" is re-stored in the memory 14 and is also supplied to the converter 16 and the controller 7. Upon reception of the trigger code "1,0,0,1", the converter 16 generates an analog DC voltage, e.g., 9 mV corresponding to the trigger code "1,0,0,1". The DC voltage of 9 mV serves as a comparison voltage at the comparator 3, so that the comparator 3 compares the input signal with the DC voltage of 9 mV. In other words, the DC voltage of 9 mV transferred to the converter 16 and corresponding to the trigger code "1,0,0,1" serves as the trigger level. Therefore, unless an input signal having a voltage higher than 9 mV is supplied to the digital oscilloscope, neither is the input signal wave data stored in the memory 6 nor is the waveform displayed on the screen of the display 8.

Since the trigger code "1,0,0,1" is transferred from the microprocessor 13 to the controller 7, the controller 7 is operated to display the trigger level of 9 mV corresponding to the trigger code "1,0,0,1" on the screen of the display 8. Therefore, although the input signal waveform is not triggered and is not displayed on the screen of the display 8, the trigger level mark or the horizontal line as the horizontal cursor which represents the present trigger level is displayed on the screen of the display 8.

The operation for decreasing the trigger level by using the device 15 will be described hereinafter. Assume that a trigger code "0,1,0,0" is stored in the memory 14. A trigger level decrease command is generated by the device 15. The microprocessor 13 reads out the trigger code "0,1,0,0" from the memory 14. A value "0,0,0,1" is subtracted from the trigger code "0,1,0,0" to obtain a code "0,0,1,1". The code "0,0,1,1" is stored in the memory 14 and is transferred to the converter 16 and the controller 7. In this case, a voltage of 3 mV corresponding to the trigger code "0,0,1,1" serves as the trigger level. When an input signal of 3 mV is supplied to the oscilloscope, the comparator 3 generates a trigger signal and the controller 4 supplies a control signal to only the memory 6. Therefore, the memory 6 stores wave data of the input signal, and the wave stored in the memory 6 is displayed on the screen of the display 8. In this case, the trigger mark or the abscissa line of the horizontal cursor which represents a 3-mV level as the present trigger level is displayed on the screen of the display 8.

The trigger code corresponding to the trigger code set by the device 15 is always transferred to the controller 7 irrespective of fetching of the input signal wave in the memory 6. Therefore, even if the input signal wave is not displayed on the display screen of the display 8, the present preset trigger level can be displayed on the screen of the display 8.

According to the present invention as described above, trigger level display is independent of input signal wave fetching, so that the presently set trigger level can be always displayed on the screen of the display. Since the trigger level is displayed on the screen of the display, the next trigger level can be properly set.

The present invention is not limited to the particular embodiment described above. Various changes and modifications may be made within the spirit and scope of the invention. For example, the present invention can also be applied to various types of equipment such as digital storage oscilloscopes, waveform recordes, FFT analyzers and waveform analyzers, all adapting the digital signal processing techniques.

What is claimed is:

1. A digital wave observation apparatus having an A/D converter for A/D converting an input signal, a trigger level setting device for setting a trigger level, a trigger signal generator for comparing the input signal with a set trigger level and generating a trigger signal, a wave memory for storing an A/D converted input signal in response to the trigger signal, and a display for displaying the input signal stored in said wave memory, comprising a trigger level display device for displaying a horizontal line corresponding to a trigger level on said display irrespective of generation of the trigger signal.

* * * * *